(12) United States Patent
Lim et al.

(10) Patent No.: US 8,570,801 B2
(45) Date of Patent: Oct. 29, 2013

(54) METHOD OF PROGRAMMING A SEMICONDUCTOR MEMORY DEVICE

(75) Inventors: Sang Oh Lim, Gyeonggi-do (KR); Jin Su Park, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 172 days.

(21) Appl. No.: 12/982,324

(22) Filed: Dec. 30, 2010

(65) Prior Publication Data

US 2011/0299341 A1 Dec. 8, 2011

(30) Foreign Application Priority Data

Jun. 4, 2010 (KR) ........................ 10-2010-0052886

(51) Int. Cl.
*G11C 11/34* (2006.01)

(52) U.S. Cl.
USPC ............ 365/185.03; 365/185.11; 365/185.12; 365/185.18; 365/185.19; 365/185.22; 365/185.24; 365/185.33

(58) Field of Classification Search
USPC ............ 365/185.03, 185.12, 185.17, 185.18, 365/185.19, 185.22, 185.33, 185.11, 185.24
See application file for complete search history.

(56) References Cited

U.S. PATENT DOCUMENTS

| 7,545,680 | B2 * | 6/2009 | Kim et al. | 365/185.17 |
| 7,602,650 | B2 * | 10/2009 | Jung et al. | 365/185.22 |
| 7,663,914 | B2 * | 2/2010 | Lee | 365/185.03 |
| 7,701,775 | B2 * | 4/2010 | Kang | 365/185.03 |
| 7,826,273 | B2 * | 11/2010 | Baik | 365/185.22 |
| 8,054,682 | B2 * | 11/2011 | Kang et al. | 365/185.03 |
| 8,199,581 | B2 * | 6/2012 | Kim | 365/185.18 |

FOREIGN PATENT DOCUMENTS

| KR | 1020080032103 | 4/2008 |
| KR | 1020090118396 | 11/2009 |
| KR | 1020090123656 | 12/2009 |

OTHER PUBLICATIONS

Notice of Allowance issued from the Korean Intellectual Property Office on Mar. 27, 2012.

* cited by examiner

*Primary Examiner* — Trong Phan
(74) *Attorney, Agent, or Firm* — IP & T Group LLP

(57) ABSTRACT

A method of programming a semiconductor memory device includes the steps of grouping memory cells in accordance with levels of threshold voltages to be programmed, programming the memory cell groups by sequentially applying program voltages to the memory cell groups, and program-verifying the memory cell groups.

12 Claims, 11 Drawing Sheets

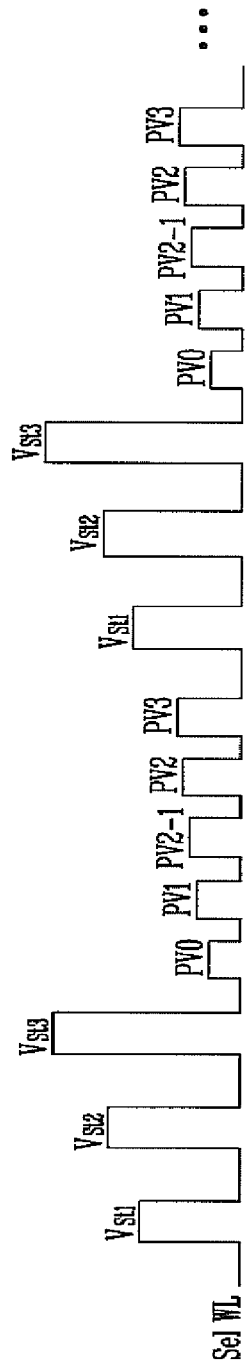

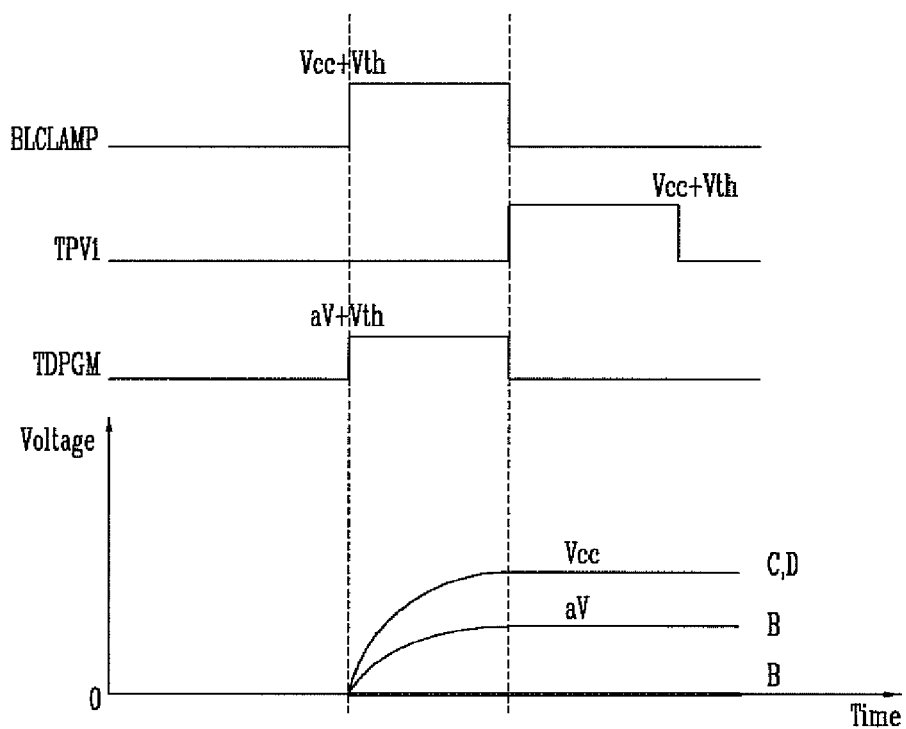

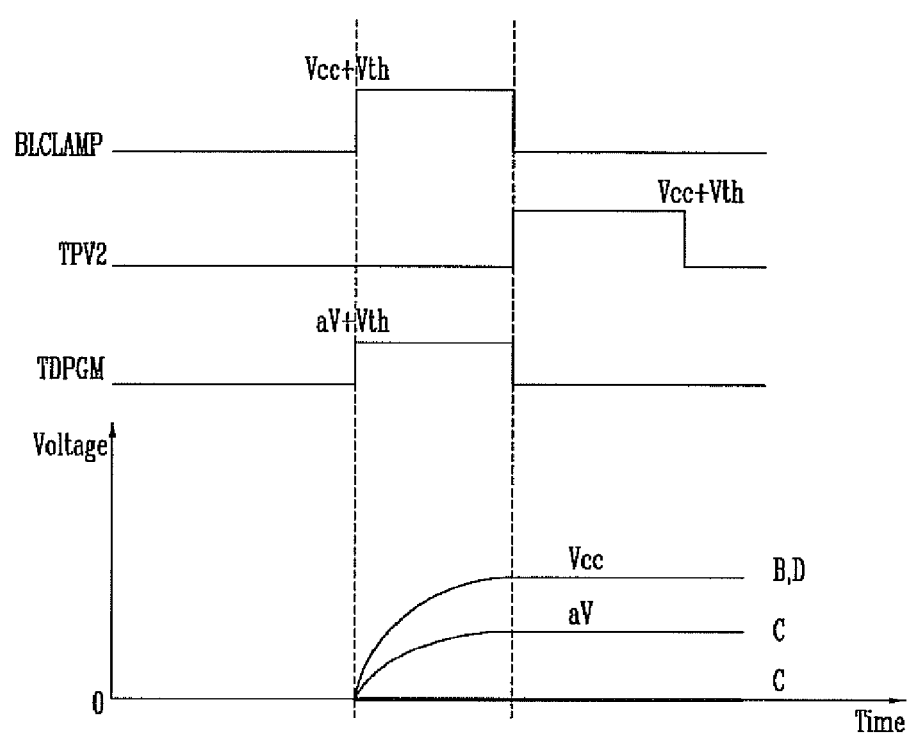

METHOD OF PROGRAMMING A SEMICONDUCTOR MEMORY DEVICE

CROSS-REFERENCE TO RELATED APPLICATIONS

The present application claims priority under 35 U.S.C 119(a) to Korean Application No. 10-2010-0052886, filed on Jun. 4, 2010, in the Korean Intellectual Property Office, which is incorporated herein by reference in its entirety as set forth in full.

BACKGROUND

1. Technical Field

Embodiments of the present invention relate generally to a method of programming a semiconductor memory device.

2. Related Art

Semiconductor memories operate as reservoirs for storing data therein, from which data are retrieved at need. Semiconductor memories are generally classified into random access memories (RAM) and read-only memories (ROM). RAMS do not retain their data when power supply is suspended, which are referred to as volatile memories. On the other hand, memories where data once stored in ROMs are maintained therein without being lost even if power supply is not supplied are referred to as nonvolatile memories.

Multi-level cells (MLC) programmable to a plurality of threshold voltage levels have been proposed for the purpose of enhancing the integration density of semiconductor memory device. In comparison, a memory cell just programmable to a single threshold voltage level is referred to as single level cell (SLC).

As threshold voltage levels in an MLC increase in number, the data storage capacity in the semiconductor memory device is extended. However, even if plural memory cells are to be programmed with a specific threshold voltage level, threshold voltages of the memory cells may be distributed over a range of threshold voltages. In addition, with an increase of the integration density, adjacent ranges of threshold voltages are becoming closer to each other in an MLC semiconductor memory device.

There are being caused inadvertent variations of threshold voltages in such MLCs, while programming, due to capacitive coupling effects with adjacent memory cells in the semiconductor memory device. Various technologies have been proposed to address these concerns.

SUMMARY

Accordingly, exemplary embodiments of the present invention are directed to a programming method capable of lessening interferences between adjacent memory cells in a semiconductor memory device employing MLCs.

In an exemplary embodiment, a method of programming a semiconductor memory device may comprise: grouping memory cells into memory cell groups in accordance with target program voltage levels; performing a program operation on the memory cell groups by sequentially applying program voltages corresponding to the target program voltage levels to the memory cell groups.

In another exemplary embodiment, a method of programming a semiconductor memory device, memory cells of which are programmed to have one of first to third threshold voltage distributions, comprise: applying a first program voltage to program a first memory cell group whose threshold voltages are to be shifted into the first threshold voltage distribution; applying a second program voltage to program a second memory cell group whose threshold voltages are to be shifted into the third threshold voltage distribution; and program-verification of the first and second memory cell groups in sequence.

In further exemplary embodiment, a method of programming a semiconductor memory device, memory cells of which are programmed to have one of first to third threshold voltage distributions, may comprise: applying a first program voltage to program a first memory cell group whose threshold voltages are to be shifted into the first threshold voltage distribution; applying a second program voltage to program a second memory cell group whose threshold voltages are to be shifted into the second third threshold voltage distribution; applying a third program voltage to program a third memory cell group whose threshold voltages are to be shifted into the third threshold voltage distribution; and program-verification of the first through third memory cell groups in sequence.

According to exemplary embodiments of the present invention, a method of programming a semiconductor memory device may lessen rates of inadvertent threshold voltage variations, while programming adjacent memory cells, by applying respective program voltages to the memory cell groups according to levels of threshold voltages to be programmed.

A further understanding of the nature and advantages of the present invention herein may be realized by reference to the remaining specification and the attached drawings.

BRIEF DESCRIPTION OF THE DRAWINGS

The present invention is illustrated by way of example, and not by way of limitation, in the figures of the accompanying drawings and in which like reference numbers refer to similar elements and in which:

FIG. 8 shows waveforms of voltages applied to a selected word line in a programming operation according to the second embodiment; and FIGS. 9A through 9C are timing diagrams illustrating a bit-line voltage setting process for the programming operation according to the second embodiment.

DESCRIPTION OF EMBODIMENTS

Hereinafter, various exemplary embodiments will now be described more fully with reference to the accompanying drawings in which some exemplary embodiments are shown. However, specific structural and functional details disclosed herein are merely representative for purposes of describing exemplary embodiments of the present invention.

The terminology used herein is for the purpose of describing particular embodiments only and is not intended to be limiting of exemplary embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations elements, components and/or groups thereof.

Further, it will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the invention. As used herein, the term "and/or" includes any and all combinations of one or more of the associated listed items. Also it should be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

In order to more specifically describe exemplary embodiments, various aspects will be hereinafter described in detail with reference to the accompanying drawings.

Figure 1:
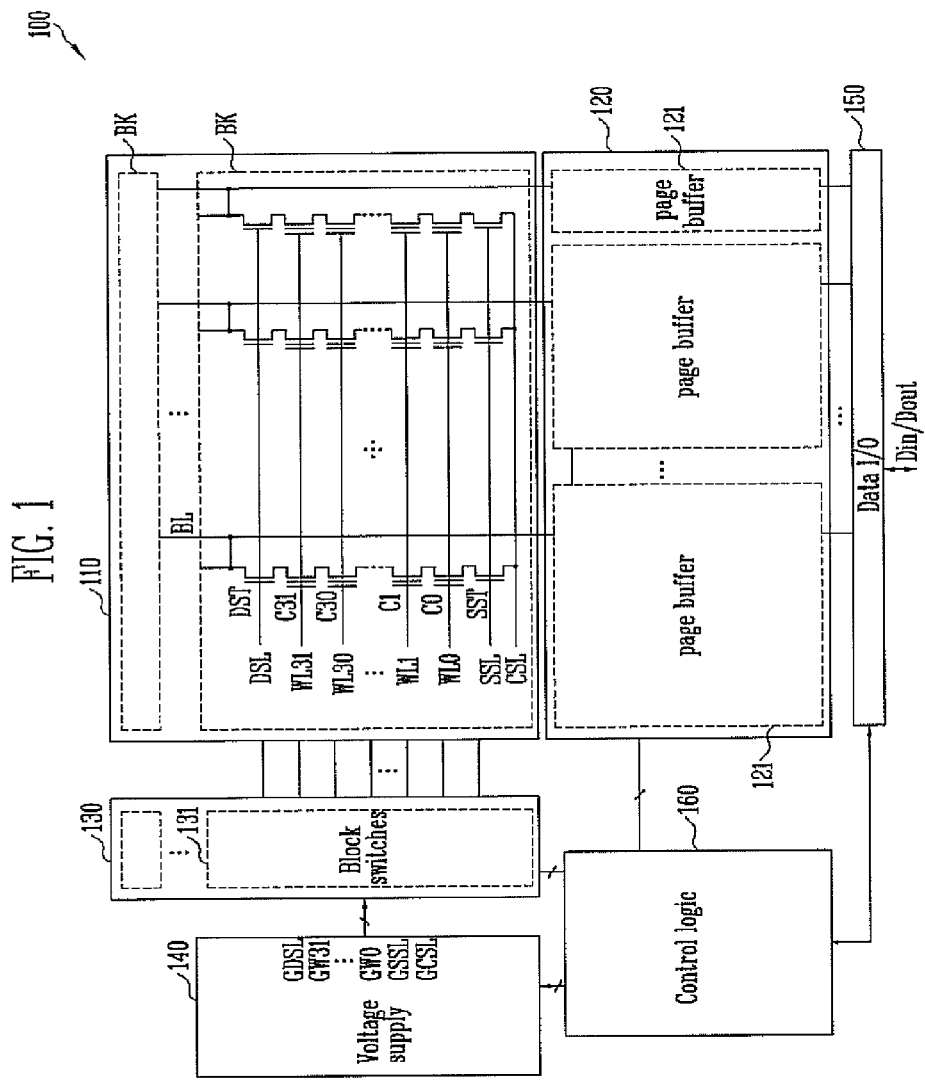
FIG. 1 schematically illustrates a semiconductor memory device according applicable in embodiments of the present invention.

FIG. 1 schematically illustrates a semiconductor memory device in accordance with an embodiment of the present invention.

Referring to FIG. 1, the semiconductor memory device 100 includes a memory cell array 110, a page buffers group 120, an X-decoder 130, a voltage supply circuit 140, an input/output logic circuit 150 and a control logic circuit 160.

The memory cell array 110 includes a plurality of memory blocks. Each memory block BK includes a plurality of cell strings. In each cell string, plural memory cells are coupled in series. The cell strings are coupled to their corresponding bit lines BL respectively.

The memory cells C0~C31 of the cell string included in the memory block BK are serially coupled between a drain selection to transistor DST and a source selection transistor SST. Threshold voltages of the memory cells C0~C31 can be programmed to be included in one of four threshold voltage distributions.

The drain of the drain selection transistor DST is coupled to the bit line BL. The source of the source selection transistor SST is coupled to a common source line CSL. The gate of the drain selection transistor DST is coupled to a drain selection line DSL. The gate of the source selection transistor SST is coupled to a source selection line SSL. The gates of the memory cells C0~C31 are respectively coupled to word line WL0~WL31.

The page buffers group 120 includes page buffers 121 coupled to the bit lines BL of the memory cell array 110. The page buffer 121 is coupled to one or more bit lines, and is driven to program data into a selected memory cell or read data from a selected memory cell.

The input/output logic circuit 150 operates to input/output data between the page buffers group 120 and an external system (not shown) operatively connected with the semiconductor memory device 100. And, the input/output logic circuit 150 provides commands, address information, etc., which are input from an external system, to the control logic circuit 160.

The X-decoder 130 enables one from the memory blocks BK of the memory cell array 110 in response to a control signal of the control logic circuit 160. For this, the X-decoder 130 includes block switches 131 coupled to the memory blocks respectively. Each block switch 131 enables its corresponding memory block BK in response to an address signal that is provided from the control logic circuit 160.

It the block switch 131 once enables the memory block BK, the drain selection line DSL, the source selection line SSL, the common source line CSL and the word lines WL0~WL31 of the enabled memory block BK are electrically within a global drain selection line GDSL, a global source selection line GSSL, a global common source line GCSL and global word lines GWL0~GWL31.

The global drain selection line GDSL, the global source selection line GSSL and the global word lines GWL0~GWL31 are supplied with operation voltages generated from the voltage supply circuit 140.

The voltage supply circuit 140 generates the operation voltages in response to control signals provided from the control logic circuit 160. These operation voltages are a program voltage, a read voltage, a verifying voltage, an erasing voltage, and so forth.

The control logic circuit 160 outputs the control signals for controlling operations of the page buffers group 120, the X-decoder 130, the input/output logic circuit 150 and the voltage supply circuit 140 in response to commands that is input through the input/output logic circuit 150.

The page buffer 121 may be coupled to one or more bit lines.

Figure 2:
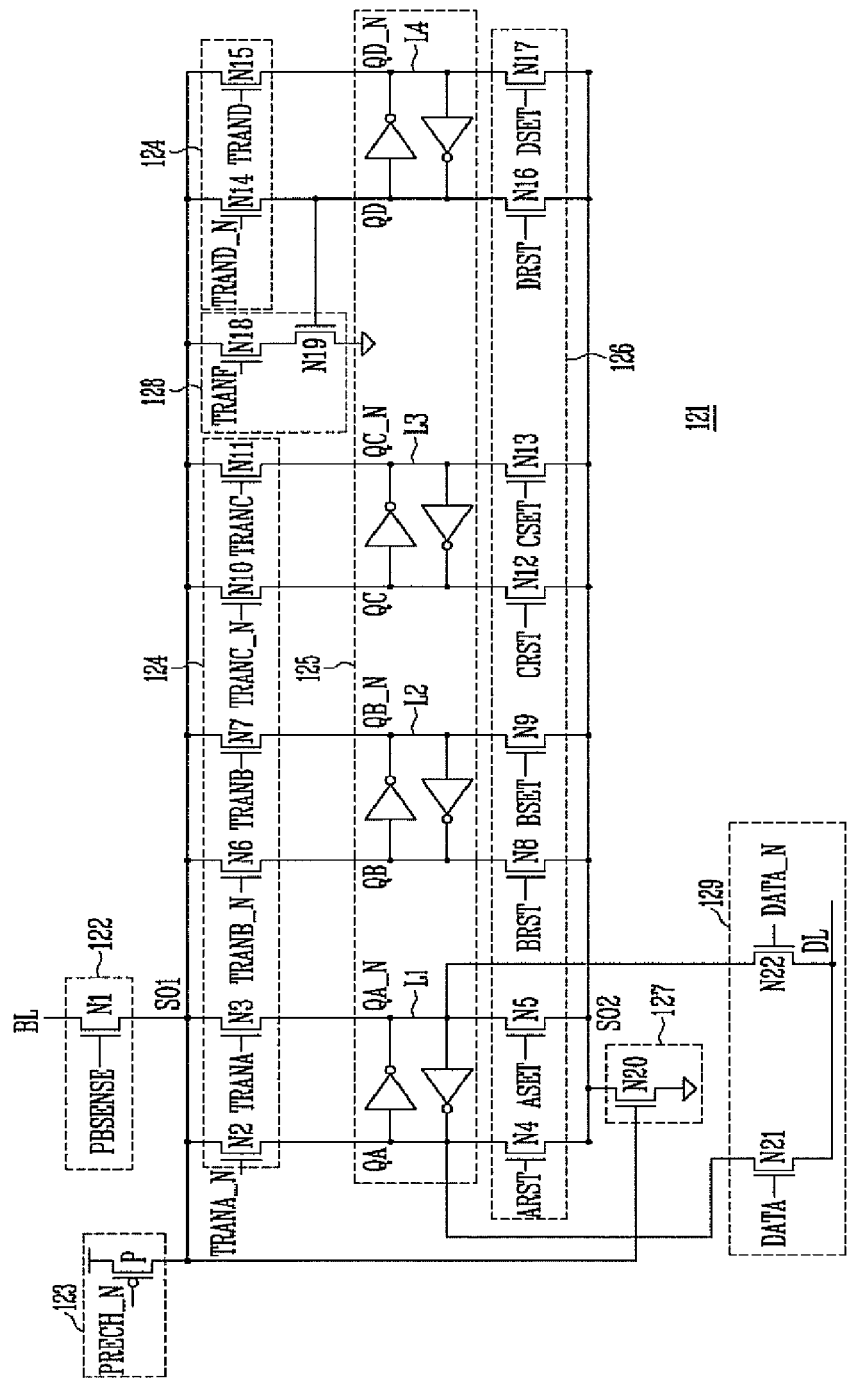
FIG. 2 illustrates the page buffer shown in FIG. 1.

FIG. 2 illustrates the page buffer shown in FIG. 1.

Referring to FIG. 2, the page buffer 121 is exemplarily composed of a bit-line connection circuit 122, a precharging circuit 123, a first data transmission circuit 124, a latch circuit 125, a data conversion circuit 126, a sensing circuit 127, a second data transmission circuit 128 and a data input circuit 129.

The bit-line connection circuit 122 includes a switching element for electrically connect the bit line BL with a first sensing node S01. The switching element of the bit-line connection circuit 122 according to an embodiment of the present invention is exemplarily formed of a first NMOS transistor N1.

The first NMOS transistor N1 is coupled between the bit line BL and the first sensing node S01, and turned on/off in response to a sensing signal PBSENSE.

The precharging circuit 123 operates to precharge the first sensing node S01 up to the level of the power voltage Vcc. For this, the precharging circuit 123 exemplarily includes a PMOS transistor P.

The PMOS transistor P is coupled between the first sensing node S01 and an input terminal of the power voltage Vcc. To the gate of the PMOS transistor P is applied a precharging signal PRECH_N.

The first and second data transmission circuits 124 and 128 transfer data from the latch circuit 125 to the first sensing node S01. The first data transmission circuit 124 may include a plurality of NMOS transistors N2, N3, N6, N7, N10, N11, N14, and N15, and the second data transmission circuit may include NMOS transistors N19 and N19.

A second NMOS transistor N2 is coupled between the first to sensing node S01 and a node QA. A third NMOS transistor N3 is coupled between the sensing node S01 and a node QA_N. To the gate of the second NMOS transistor N2 is applied an inversed first transmission signal TRANA_N. To the gate of the third NMOS transistor N3 is applied a first transmission signal TRANA.

A sixth NMOS transistor N6 is coupled between the first sensing node S01 and a node QB. A seventh NMOS transistor N7 is coupled between the first sensing node S01 and a node QB_N. To the gate of the sixth NMOS transistor N6 is applied an inversed second transmission signal TRANB_N. To the gate of the seventh NMOS transistor N7 is applied a second transmission signal TRANB.

A tenth NMOS transistor N10 is coupled between the first sensing node S01 and a node QC. An eleventh NMOS transistor N11 is coupled between the first sensing node S01 and a node QC_N. To the gate of the tenth NMOS transistor N10 is applied an inversed third transmission signal TRANC_N. To the gate of the eleventh NMOS transistor N11 is applied a third transmission signal TRANC.

A fourteenth NMOS transistor N14 is coupled between the first sensing node S01 and a node QD. A fifteenth NMOS transistor N15 is coupled between the first sensing node S01 and a node QD_N, To the gate of the fourteenth NMOS transistor N14 is applied an inversed fourth transmission signal TRAND_N. To the gate of the fifteenth NMOS transistor N15 is applied a fourth transmission signal TRAND.

Eighteenth and nineteenth NMOS transistors N18 and N19 are coupled between the first sensing node S01 and a ground node in series. To the gate of the eighteenth NMOS transistor N18 is applied a fifth transmission signal TRANF. The gate of the nineteenth NMOS transistor N19 is coupled to the node QD.

The latch circuit 125 includes first to fourth latches L1~L4. Each of the latches L1~L4 included in the latch circuit 125 may be formed of two inverters, that are coupled with each other.

The first latch L1 is interposed between the nodes QA and QA_N. The second latch L2 is interposed between the nodes QB and QB_N. The third latch L3 is interposed between the nodes QC and QC_N. The fourth latch L4 is interposed between the nodes QD and QD_N.

The data conversion circuit 126 operates to change or retain data of the first to fourth latches L1~L4 in accordance with a voltage level of a second sensing node S02. The data conversion circuit 126 may include a plurality of NMOS transistors N4, N5, N8, N9, N12, N13, N16, and N17.

A fourth NMOS transistor N4 is coupled between the node QA and the second sensing node S02, and the fifth NMOS transistor N5 is coupled between the node QA_N and the second sensing node S02. To the gate of the fourth NMOS transistor N4 is applied a first reset signal ARST. To the gate of the fifth NMOS transistor N5 is applied a first set signal ASST.

An eighth NMOS transistor N$ is coupled between the node QB and the second sensing node S02, and the ninth NMOS transistor N9 is coupled between the node QB_N and the second sensing node 502. To the gate of the eighth NMOS transistor N8 is applied a second reset signal BRST. To the gate of the ninth NMOS transistor N9 is applied a second set signal BEET.

A twelfth NMOS transistor N12 is coupled between the node QC and the second sensing node S02, and the thirteenth NMOS transistor N13 is coupled between the node QC_N and the second sensing node S02. To the gate of the twelfth NMOS transistor N12 is applied a third reset signal CRST. To the gate of the thirteenth NMOS transistor N13 is applied a third set signal CSET.

A sixteenth NMOS transistor N16 is coupled between the node QD and the second sensing node S02, and the seventeenth NMOS transistor N17 is coupled between the node QD_N and the second sensing node S02. To the gate of the sixteenth NMOS transistor N16 is applied a fourth reset signal DRST. To the gate of the seventeenth NMOS transistor N17 is applied a fourth set signal DSET.

A twentieth NMOS transistor N20 of the sensing circuit 127 operates to electrically connect the second sensing node S02 with the ground node in accordance with a voltage level of the first sensing node S01. For this, the twentieth NMOS transistor N20 is coupled between the second sensing node S02 and the ground node. The gate of the twentieth NMOS transistor N20 is coupled to the first sensing node S01.

The data input circuit 129 may be coupled to, for example, only the first latch L1 and store data, which is input through a data line DL, into the first latch L1.

A twenty-first NMOS transistor N21 of the data input circuit 129 is coupled between the node QA and the data line DL. A twenty-second NMOS transistor N22 of the data input circuit 129 is coupled between the node QA_N and the data line DL. To the gate of the twenty-first NMOS transistor N21 is applied a data signal DATA. To the gate of the twenty-second NMOS transistor N22 is applied an inversed data signal DATA_N.

An exemplary data input mode is described as follows.

First, the node QA_N of the latch L1 is initialized to '1'. The data line DL is electrically connected to the ground node.

Then, the data signal DATA is changed according to data input thereto. For example, if input data is '1', the data signal DATA is applied with a logic high level and the inversed data signal DATA_N is applied with a logic low level. Thus, the twenty-first NMOS transistor N21 is turned on to electrically connect the node QA with the ground node. During this, the node QA_N is kept in '1'.

If input data is '0', the data signal DATA is applied with a logic low level and the inversed data signal DATA_N is applied with a logic high level. Thus, the twenty-second NMOS transistor N22 is turned on to electrically connect the node QA_N with the ground node. That is, data '0' is input into the node QA_N.

This data input mode is an example, which can be variously modified in association with a formation of the page buffers circuit.

The page buffer 121 latches data that is to be stored into a selected memory cell, and transfers the latched data to the first to sensing node in a programming operation.

Further, the page buffer 121 reads and stores data from a selected memory cell.

The control signals, i.e., PBSENSE, PRECH_N, TRANA, etc., applied to the page buffer 121 are generated from the control logic circuit 160.

Figure 3:
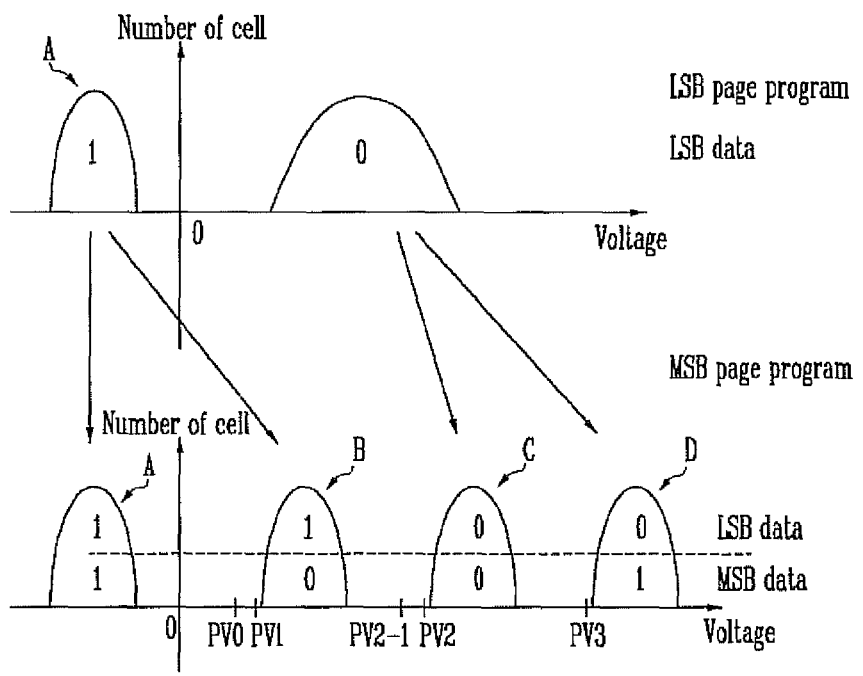
FIG. 3 graphically shows threshold voltage distributions of programmed memory cells.

FIG. 3 graphically shows threshold voltage distributions of programmed memory cells.

Referring to FIG. 3, threshold voltages of the memory cells move from an erased state A by means of least-significant-bit (LSB) and most-significant-bit (MSB) pages programming processes.

After the LSB page program operation is performed based on a LSB data, threshold voltages of the memory cells continue to be in the erased state A or changed to a threshold voltage distribution 0.

After the MSB page program operation is performed based on a MSB data, the threshold voltages of the memory cells in the erased state A continue to be in the erased state A or are included in a threshold voltage distribution B. For example, a part of the memory cells that have been in the erased state may still be maintained in the erased state A, and the rest of the memory cells may be programmed.

A part of the memory cells that have threshold voltages over 0V by the LSB page programming have a higher level of threshold voltage as to be included in a threshold voltage distribution D, and the rest of the memory cells continue to have threshold voltage in a threshold voltage distribution C.

This programming mode is called 'reprogramming'.

The LSB page programming is same as a general programming mode of single level cells.

In the MSB page programming mode, the threshold voltage distributions B, C and D are program-verified by means of first to third verifying voltages PV1, PV2 and PV3 and double verifying voltages PV0 and PV2-1.

In order to form such threshold voltage distributions A, B, C and D as shown in FIG. 3, a selected word line is supplied with program and verifying voltages, in sequence, as follows.

Figure 4:
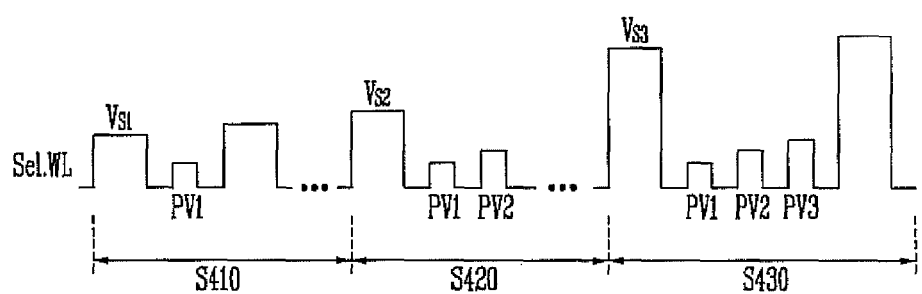
FIG. 4 shows waveforms of voltages applied to a selected word line for programming.

FIG. 4 shows waveforms of voltages applied to a selected word line for programming.

The semiconductor memory device 100 operates to apply a program voltage in the incremental step pulse programming (ISPP) scheme. The ISPP scheme is conducted by increasing a program voltage from a predetermined program start voltage in the unit of step voltage. After applying the program voltage, verifying voltages are sequentially applied to programmed memory cells for program verification.

Referring to FIGS. 3 and 4, assuming that an LSB page has been already programmed, a first program start voltage Vs1 is applied to a selected word line for MSB page programming.

By applying the first program start voltage Vs1, threshold to voltages of the memory cells are elevated. It is less probable for the threshold voltages to be shifted over the second verifying voltage PV2 during a first time of applying the first program start voltage Vs1. Thus, program verification to a result of such a first programming is carried out just by a first verification with the first verifying voltage PV1. If there is a need to make a width of the threshold voltage distribution to be narrower, a first double verification may be conducted with the first double verifying voltage PV0.

After the first verification, a program voltage raised by a step voltage is applied to the selected word line and the first verification is resumed (S410).

When the program voltage rises up to a predetermined level (Vs2), a second verification is conducted with the second verifying voltage PV2 (S420), as well as the first verification. During this, it is permissible to add a second double verification with the second double verifying voltage PV2-1.

After the program voltage is raised to exceed a third program start voltage Vs3, first to third verification operations are all carried out with the first to third verifying voltages PV1, PV2 and PV3 (S430).

As such, while the program and verifying voltages are being applied to a selected word line, threshold voltages of memory cells coupled to the selected word line are changed to other distribution state or retained in their prior states.

In this procedure, memory cells to be included in the threshold voltage distribution D can be regarded as programmed after the program voltage arrives at the third program start voltage Vs3. And, at the time of applying the third program start voltage Vs3, a part of memory cells included in the threshold voltage distributions B and C can be completely programmed.

Here, while the memory cells to be included in the threshold voltage distribution D are being programmed, there would be incurred data distortion due to interference by capacitive couplings, because memory cells, which are included in the threshold voltage distributions B and D and completed in programming, are continuously supplied with the program voltage.

In regard to this concern, embodiments of the present invention are configured in the following manners for programming.

Figure 5:
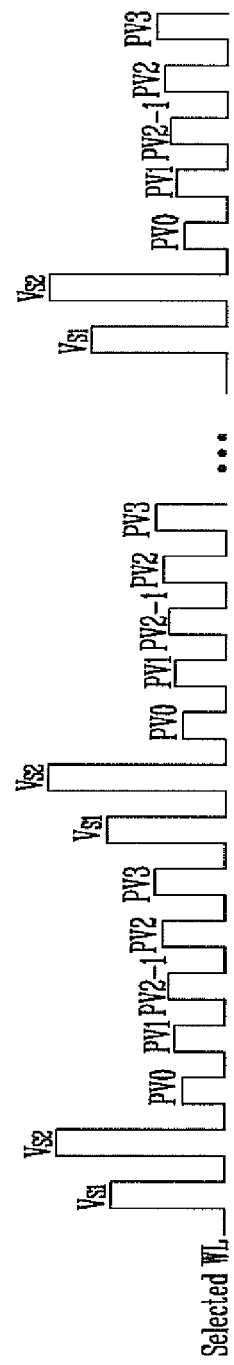
FIG. 5 shows waveforms of program and verifying voltage a programming operation according to a first embodiment of the present invention.

FIG. 5 shows waveforms of the program and verifying voltages in a programming operation according to a first embodiment of the present invention, which is described with reference to the page buffer 121 of FIG. 2 and the threshold voltage distribution diagram of FIG. 3.

The program and verifying voltages shown in FIG. 5 are to be applied to a selected word line (Selected WL) during an MSB page programming, for which the program voltage is applied twice at one time. That is, the selected word line are sequentially applied with a first program start voltage Vs1 for shifting the memory cells into the threshold voltage distributions B and C, and a second program start voltage Vs2 for shifting the memory cells into the threshold voltage distribution D.

Hereinafter, memory cells to be programmed in the threshold voltage distribution B are referred to as 'first memory cell group'; memory cells to be programmed in the threshold voltage distribution C are referred to as 'second memory cell group'; memory cells to be programmed in the threshold voltage distribution D are referred to as 'third memory cell group'. And, memory cells of the erased state (corresponding to the threshold voltage distribution A) are referred to as 'erased cell group'.

Referring to FIG. 5, subsequent to the first program start voltage Vs1 for the first and second memory cell groups, the second program start voltage Vs2 for the third memory cell group is applied to the selected word line.

Before applying the first program start voltage Vs1 for the first and second memory cell groups, the memory cells included in the erased cell group and the third memory cell group are to be inhibited from being programmed by the first program start voltage Vs1. For this program inhibition, a bit-line setting operation is conducted by means of the first to fourth latches L1~L4 of the page buffers 121. The bit-line setting operation is detailed later.

Meanwhile, the erased cell group, and the first and second memory cell groups are not to be programmed while applying the second program start voltage Vs2.

In the semiconductor memory device, the programming operation can be divided into two modes.

One is a program mode to raise a threshold voltage of a memory cell and the other is an inhibition mode to hold a threshold voltage of a memory cell at a current state.

The control logic circuit 160 sets a bit line, which is coupled to a memory cell to be programmed, on 0V by means of data stored in the first to fourth latches L1~L4, and precharges a bit line, which is coupled to a memory cell to be program-inhibited, to the level of the power voltage Vcc.

In the ISPP scheme, a program-verification is conducted after programming. In the embodiment of the present invention, the program-verification begins after applying the first and second program start voltage Vs1 and Vs2.

During this, the first and second memory cell groups are processed in a double verification using two program-verifying voltages. Referring to FIG. 5, the voltages for double verification the first and second memory cell groups are noticed by PV0 and PV2-1.

In the page buffer 121 depicted in FIG. 2, the second and third latch L2 and L3 are used for programming, program-verification, and double program-verification of the first and second memory cell groups. The fourth latch L4 is used for program-verification the third memory cell group.

The programming operation according to the first embodiment is, described in more detail with reference to FIGS. 2 to 4.

To program the semiconductor memory device 100, first, there is an input of a command, address information, data to be to programmed (hereinafter, referred to as 'program data'), and so on from an external system. These command, address information and program data are provided into the data input/output circuit 120.

The command and address information are transferred into the control logic circuit 160. The program data are transferred into the page buffers group 120. The control logic circuit 160 controls the data input/output logic circuit 150 and the page buffers group 120 by the command and address information so as to latch the program data at the page buffers 121.

In the first embodiment, it is assumed that an LSB page programming has been already completed.

To program an MSB page, MSB data introduced through the data input/output circuit 150 are input into the first latches L1 of the page buffer group 120 in turn. This MSB latching is carried out after LSB data are latched at all of the page buffers 121 of the page buffers group 120.

Referring to FIG. 2, the nodes QA, QB, QC and QD of the first to fourth latches L1~L4 are initialized on '1' at the beginning of programming.

Then, MSB data is input into the page buffers 121, which are exemplarily denoted in four digits for describing the threshold voltage distributions A, B, C and D. For example, assuming that '1010' is input to the nodes QA of the page buffers 121, it means that: '1' is input to the node QA of the page buffer 121 coupled to the erased memory cell group; '0' is input to the node QA of the page buffer 121 coupled to the first memory cell group; '1' is input to the node QA of the page buffer 121 coupled to the second memory cell group; and '0' is input to the node QA of the page buffer 121 coupled to the third memory cell group.

Table 1 summarizes data patterns to be set at the nodes of the page buffers 121 for the programming operation according to the first embodiment of the present invention.

Referring to Table 1 and FIG. 2, the nodes QA_N, QB_N, QC_N and QD_N are first initialized to be '1'. For this initialization, the precharging signal PRECH_N is applied to charge the first sensing node to the power voltage level. Then, the first to fourth reset signals ARST, BRST, CRST and DRST are generated in high levels.

If the first sensing node S01 is precharged, the twentieth NMOS transistor N20 is turned on to electrically connect the second sensing node S02 to the ground node. As the first to fourth reset signals ARST, BRST, CRST and DRST are applied to the data conversion circuit 126, the fourth, eighth, twelfth and sixteenth NMOS transistors N4, N8, N12 and N16 are all turned on.

If the fourth, eighth, twelfth and sixteenth NMOS transistors N4, N8, N12 and N16 are turned on, the nodes QA, QB, QC and QD are electrically connected to the ground node. Thus, the nodes QA_N, QB_N, QC_N and QD_N are set on '1'.

After initialization, the MSB data is input into the first latches LY through the data line DL. The procedure of data input was described in relevance with the data input circuit 129 of FIG. 2, so it will not be further detailed.

The MSB data is input in '1010' exemplarily in accordance with the threshold voltage distributions A, B, C and D. A digit pattern of the MSB data can be variable by how to define digital data corresponding respectively to the threshold voltage distributions A, B, C and D.

As shown in Table 1, if there is an input of the MSB data, the nodes QA_N of the page buffer 121 are only changed to '1010' while the other nodes QB_N, QC_N and QD_N are held on their initial states.

For setting data, data are copied from the nodes QA_N to the nodes QB_N, QC_N and QD_N.

In copying data, the precharge signal PRECH_N is activated to precharge the first sensing node S01 to the level of the power voltage Vcc. For convenience of description, a case of precharging a node to the level of the power voltage Vcc is represented as '1', Further, a case of electrically connecting a node to the ground node or discharging/pulling down the node is represented as '0'.

TABLE 1

| | Node | | | | | | | | | | | | | | | |
|---|---|---|---|---|---|---|---|---|---|---|---|---|---|---|---|---|
| | QA_N | | | | QB_N | | | | QC_N | | | | QD_N | | | |
| Vt Distribution | A | B | C | D | A | B | C | D | A | B | C | D | A | B | C | D |
| Initialization (PRECH_N, ARST, BRST, CRST, DRST) | 1 | 1 | 1 | 1 | — | — | 1 | 1 | 1 | 1 | — | 1 | 1 | 1 | 1 | 1 |
| MSB Input (through data line) | 1 | 0 | 1 | 0 | — | — | 1 | 1 | 1 | 1 | — | 1 | 1 | 1 | 1 | 1 |
| QA_N→QB_N, QC_N, QD_N (PRECH_N, TARNA, BRST, CRST, DRST) | 1 | 0 | 1 | 0 | — | 0 | 1 | 0 | 1 | 0 | — | 0 | 1 | 0 | 1 | 0 |
| QA_N Reset (PRECH_N, ARST) | 1 | 1 | 1 | 1 | — | 0 | 1 | 0 | 1 | 0 | — | 0 | 1 | 0 | 1 | 0 |
| LSB Loading | 1 | 1 | 0 | 0 | — | 0 | 1 | 0 | 1 | 0 | — | 0 | 1 | 0 | 1 | 0 |
| QA_N→ QD_N (PRECH_N, TRANA, DRST) | 1 | 1 | 0 | 0 | — | 0 | 1 | 0 | 1 | 0 | — | 0 | 1 | 1 | 1 | 0 |
| QA→ QB_N, QC_N (PRECH_N, TRANA_N, BSET, CSET) | 1 | 1 | 0 | 0 | — | 0 | 0 | 0 | 1 | 0 | 0 | 0 | 1 | 1 | 1 | 0 |
| QD→QB_N, QC_N (PRECH_N, TRAND_N, BRST, CRST) | 1 | 1 | 0 | 0 | — | 0 | 0 | 1 | 1 | 0 | 0 | 1 | 1 | 1 | 1 | 0 |

If the first transmission signal TRANA is applied in '1', the third NMOS transistors N3 are turned on to transfer data into the first sensing nodes S01 from the nodes QA_N. If the node QA_N is set on '1', the first sensing node S01 is still held on '1'. If the node QA_N is set on '0', the first sensing node S01 goes to '0'.

The first sensing nodes S01 of the page buffers 121 are thereby conditioned in '1010'. The twentieth NMOS transistor N20 is turned on when the first sensing node S01 is set on '1', but turned off when the first sensing node S01 is set on '0'.

If the twentieth NMOS transistor N20 is turned on in response to the first sensing node S01 that is in '1', the second sensing node S02 is conductive to the ground node. Contrarily, if the twentieth NMOS transistor N20 is turned off by the first sensing node S01 that is being in '0', the second sensing node S02 is conditioned in a floating state.

Then, the second to fourth reset signals BRST, CRST and DRST are activated to '1'. Accordingly, the nodes QB_N, QC_N and is QD_N are all changed to '1010'. When the first sensing nodes S01 is set at '0' and the second sensing node S02 is conditioned in a floating state, the other nodes QB_N, QC_N and QD_N seem to be held in their previous states, i.e., '1'.

Next, the node QA_N is reset. To reset the node QA_N, the precharging signal PRECH_N is activated to condition the first sensing node in '1'. As the first sensing node S01 is conditioned in '1', the twentieth NMOS transistor N20 is turned on to make the second sensing node S02 go to '0'. If the first reset signal ARST is applied with '1' when the second sensing node S02 is conditioned in '0', the node QA goes to '0' and the node QA_N is reset to '1'.

Afterward, LSB data are loaded from memory cells that have been programmed by the LSB page programming. Loaded LSB data are stored at the nodes QA_N.

As shown in FIG. 3, the LSB data is '1100'. This data loading technique is well known in the art, so it is not be further detailed.

Data of the nodes QDN are changed by the LSB data loaded on the nodes QA_N. The precharging signal PRECH_N is applied to set the first sensing node on '1'.

The first transmission signal TRANA is applied to transfer data from the node QA_N to the first sensing node S01. Accordingly, the first sensing nodes S01 of the page buffers 121 are conditioned on '1100'. And the fourth reset signal DRST is activated.

The twentieth NMOS transistor N20 is turned on only if the first sensing node S01 is staying in '1'. And the fourth latch L4 is permitted to change its data only if the twentieth NMOS transistor N20 is turned on.

After the first sensing nodes S01 of the page buffers 121 are changed to '1100', the fourth reset signal DRST is applied to set the nodes QD_N from '1010' to '1110'. Referring to the table 1, the node QD_N only changes from '0' to '1' when the first sensing node So1 is '1', otherwise it doesn't change.

Next, the node QA, that is the inversed node of the node QA_N, is used to change data of the QB_N and QC_N.

The precharging signal PRECH_N is applied to make the first sensing node S01 set on '1'. By applying the inversed first transmission signal. TRANA_N, the first sensing nodes S01 of the page buffers 121 are set on '0011'.

And, by applying the second and third set signals BSET and CSET, the nodes QB_N and QC_N are set on '1000'. Finally, the node QD is used to change data of the QB_N and QC_N. The precharging signal PRECH_N is applied to make the first sensing node 501 set at '1'. By applying the inversed fourth transmission signal TRAND_N, the first sensing nodes S01 of the page buffers 121 are set at '0001'. And by applying the second and third set signals BSET and CSET, the nodes QB_N and QC_N are set at '1001', which can be seen as same with the MSB data shown in FIG. 3. By way of such a data setting process, the LSB data '1100' are input into the nodes QA_N and the MSB data '1001' are input into the nodes QB_N.

The nodes QB_N and QC_N of the page buffers 121 are used in programming and verifying the first and second memory cell groups. The nodes QA_N are used as flag latches for differentiating the first and second memory cell groups. The nodes QD_N of the page buffers 121 are used in programming and verification of the third memory cell group.

After completing the data setting as resulting in Table 1, programming with the MSB data begins.

The first process of programming is to set bit line voltages.

By setting bit line voltages, a memory cell coupled to a bit line that is set on 0V is programmed while a memory cell coupled to a precharged bit line is program-inhibited. In the meantime, a memory cell coupled to a bit line that is precharged to aV ('a' is a voltage value of a positive integer), which is higher than 0V but lower than the power voltage Vcc, is programmed in a slower rate. In practice, the bit line precharged to aV is coupled to memory cells which have passed a program-verification course with the first and second double verifying voltages PV0 and PV2-1, but been to determined as failed by a program-verification with the verifying voltages PV1 and PV2.

In the exemplary embodiment, the first program start voltage Vs1 is first applied for the first and second memory cell groups and the second program start voltage Vs2 is applied for the third memory cell groups. While applying the first program start voltage Vs1, the third memory cell group must be program-inhibited, While applying the second program start voltage Vs2, the first and second memory cell groups must be program-inhibited. Meantime, an erased cell should be normally inhibited from being programmed.

For the selective program inhibition, the bit lines are set in the manner as follows.

First, all of the bit lines BL are precharged to '1'. During this, the bit lines are electrically disconnected to the first sensing nodes S01 of the page buffers 121.

Under the condition that the bit lines BL are being disconnected with the first sensing nodes S01, the precharge signal PRECH_N is applied to the page buffers 121 to set the first sensing nodes S01 on '1'. When the second transmission signal TRANB is applied, the first sensing nodes S01 go to '1001'.

Then, when the sensing signal PBSENSE is applied to the page buffers 121 in the level of Vcc+Vth, a bit line coupled to the page buffer where the first sensing node S01 is conditioned in '1' is precharged up to the level of Vcc while a bit line coupled to the page buffer where the first sensing node S01 is conditioned in '0' is discharged down to 0V. This process of setting bit-line voltages according to states of the nodes QB_N may be referred to as 'first setting'.

Next, the sensing signal PBSENSE goes to 0V and the first sensing nodes S01 are precharged to '1'. Then, the third data transmission signal TRANC is applied to change the first sensing nodes S01 in accordance with states of the nodes QC_N.

As the nodes QC_N are laid on '1001' at the beginning of programming, the first sensing nodes S01 are too conditioned on '1001'. And the sensing signal PBSENSE is applied in the level of aV+Vth. This process for setting bit lines according to states of the nodes QC_N may be referred to as 'second setting'.

After the second setting, a bit line that has been conditioned on '1' by the first sensing operation still remains in the state of '1'. A bit line that has been conditioned on '0' by the first sensing operation is changed in voltage to correspond to a state of the first sensing node S01.

For example, if the sensing signal PBSENSE is applied in the level of aV+Vth while a bit line of '0' is being electrically connected to the first sensing node S01 that is conditioned on '1', the bit line is precharged to aV. But, if a bit line of '0' is electrically connected to the first sensing node S01 that is conditioned on '0', the bit line is still held on '0'.

A memory cell coupled to a bit line that is charged at aV is programmed later than a memory cell coupled to a bit line, which is laid on 0V, in programming rate, In other words, the first and second setting operations are performed to set voltages of bit lines that are coupled to memory cells to be processed by the double verification.

As shown in FIG. 5, when the first program start voltage Vs1 is activated, programming is performed, for example, only on the memory cells belonging to the first and second memory cell groups, This is hereinafter referred to as 'first programming'.

After the first programming, programming is conducted to the third memory cell group. For this, all bit lines are re-precharged to '1'. At this time, the bit line BL is being disconnected with the first sensing node S01.

In the condition that the bit line is disconnected with the first sensing node S01, the precharging signal PRECH_N is applied to set the first sensing node S01 on '1'. And, by applying the fifth transmission signal TRANF, the first sensing nodes S01 become '1100' to put the third memory cell group into a programming mode.

Being electrically connected to the first sensing nodes S01 in the condition of '1110', the bit lines BL are set on '1110'. This process for setting the bit lines according to states of the nodes QD_N may be referred to as 'third setting'.

In the meantime, if the second program start voltage Vs2 is applied to the selected word line (Sel WL), the third memory cell group is exclusively programmed but the first and second memory cell groups. For descriptive convenience, programming only the third memory cell group may be referred to as 'second programming'. Afterward, whenever a program pulse is applied, the program voltage used in the first and second programming operations is elevated by the unit of the step voltage from the first and second program start voltages Vs1 and Vs2.

By the operations aforementioned, the first and second memory cell groups can be programmed in a rate similar to the third memory cell group. As a result, it lessens an effect of interference due to a skew of programming rates between the first and second memory cell groups and the third memory cell group. According to another embodiment, it is also permissible to apply the program voltage for the second and third memory cell groups after applying it for the first memory cell group.

After performing the first and second programming operations, the first to third program-verification operations begin.

Figure 6:
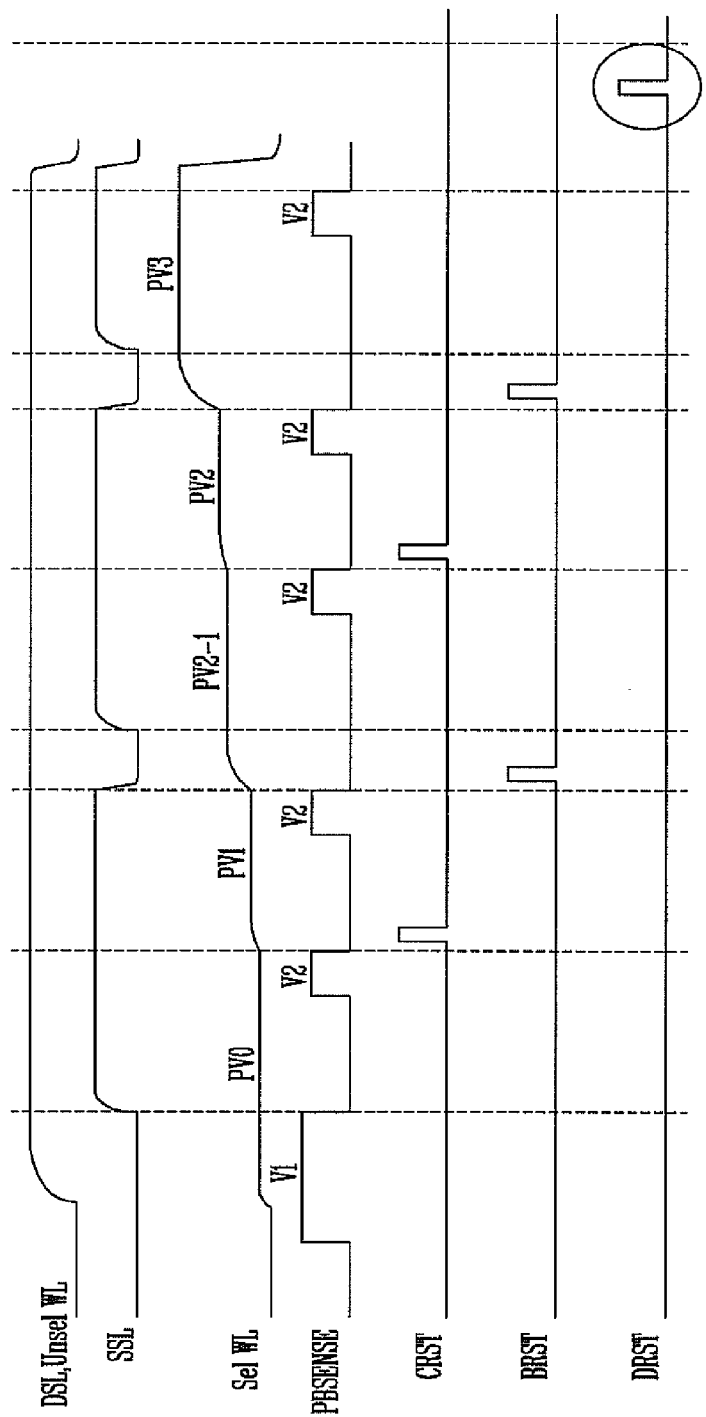
FIG. 6 is a timing diagram illustrating program-verification operations, after programming, according to the first embodiment.

FIG. 6 is a timing diagram illustrating the program-verification operations, after programming, according to the first embodiment of the present invention, which is described with reference to FIG. 5.

Referring to FIG. 6, the program-verification operations are progressed in sequence by using the first to third verifying voltages PV1~PV3 and the first and second double verifying voltages PV0 and PV2-1.

During this, verified results from the first and second memory cell groups are stored in the second and third latches L2 and L3, while a verified result from the third memory cell group is stored to in the fourth latches L4.

In detail, bit lines BL are first precharged. During this, the sensing signal PBSENSE is leveled on a first voltage V1. After precharging the bit lines, the first double verifying voltage PV0 is applied to the selected word line (Sel WL), while a pass voltage Vpass is applied to unselected word lines (tinsel WL).

Then, this condition continues until there are voltage variations on the bit lines. During this, the bit lines are disconnected with the first sensing nodes S01 of the page buffers 121.

After precharging the first sensing nodes S01 to '1', the first data transmission signal TRANA is applied to the page buffers 121, which is for the purpose of differentiating the first and second memory cell groups. If the nodes QA_N are set on '1', it corresponds to the first memory cell group. If the nodes QA_N are set on '0', it corresponds to the second memory cell group.

For a page buffer coupled to the second memory cell group, the first sensing nodes S01 is changed to '0' if the first data transmission signal TRANA is applied after precharging the first sensing nodes S01 to '1'. Thus, the second and third latches L2 and L3 are not affected from the program-verification operation with the first double verifying voltage PV0. This is a process of setting voltages on the first sensing nodes S01 for program-verification.

If such voltage setting of the first sensing node is completed, the sensing signal PBSENSE is applied in a second voltage V2. According to a voltage of the bit line, the first sensing node S01 is discharged or maintained on the prior precharged state. And, the third reset signal CRST is applied to store a verified result by the first double verifying voltage PV0 into the third latches L3. Hereinafter, the program-verification operation with the first double verifying voltage PV0 may be referred to 'first double verification'.

If the programming has been passed, the first sensing node S01 is held on a high level without changing. Thus, the nodes QC_N of the third latches L3 go to '1'. As the first sensing nodes S01 are set in voltage, the nodes QC_N of the page buffers coupled to the second memory group are not affected from the double verification.

After the first double verification operation, the voltage level of the sensing signal PBSENSE returns to 0V and the bit lines BL is electrically disconnected to the first sensing nodes S01.

The selected word line (Sel WL) is changed to the first verifying voltage PV1 and retained thereon for a time until the bit line voltages changes. This mode of conducting such several verifying stages by one-time bit line precharcing may be referred to as 'fast verification'.

After a change of bit line voltage, the first sensing nodes S01 are re-precharged to '1' and the first data transmission signal TRANA is applied to the page buffers 121. Then, the second reset signal BRST is applied to store a result of the first verification into the nodes QB_N.

After the first verification, the sensing signal PBSENSE returns to 0V. The second double verifying voltage PV2-1 is applied to the selected word line (Sel WL) and retained thereon until the bit line voltage changes.

Afterward, the first sensing nodes S01 are precharged to '1' and the sensing signal PBSENSE is applied in the level of the second voltage V2. During this, there is no need of applying the first data transmission signal TRANA to the page buffers 121. This is because the program-verification for the first memory cell group has been completed and the paged buffers 121 coupled to the first memory cell group is not affected from a program-verification for the second memory cell group. This program-verification process with the second double verifying voltage PV2-1 may be referred to as 'second double verification'.

A result of the second double verification is stored in the third latches L3 of the page buffers 121. A result of the second verification with the second verifying voltage PV2 is stored in the second latches L2 of the page buffers 121. Even during the second verification with the second verifying voltage PV2, the first data transmission signal TRANA is not applied to the page buffers.

Finally, for the third verification with the third verifying voltage PV3, the sensing signal PBSENSE is applied in 0V. The third verifying voltage PV3 is applied to the selected word line (Sel WL) to sense bit line voltages from the programmed memory cells.

A result of the third verification is stored in the fourth latches of the page buffers 121.

If the programmed pages are detected as failed pages after completing the first to third verification operations, and the first and second double verification operations, the procedure of the first and second programming steps, the first to third verifying steps, and the first and second double verification steps is repeated.

By way of the aforementioned procedure, sequentially applying a program voltage to the first and second memory cell groups and a program voltage to the third memory cell group makes it possible to program-inhibit the third memory cell group while programming the first and second memory cell groups and to program-inhibit the first and second memory cell groups while programming the third memory cell group. Different from the page buffer exemplarily shown above (e.g., that of FIG. 2), even another type of page buffer employing a dynamic latch may be also used to conduct the same function, but partial modifications of control signals.

In a second embodiment, program voltages are sequentially applied to program first to third memory cell groups, as described with reference to a page buffer including a dynamic latch.

FIGS. 7A through 7D illustrate page buffers according to the second embodiment of the present invention.

Figure 7A:
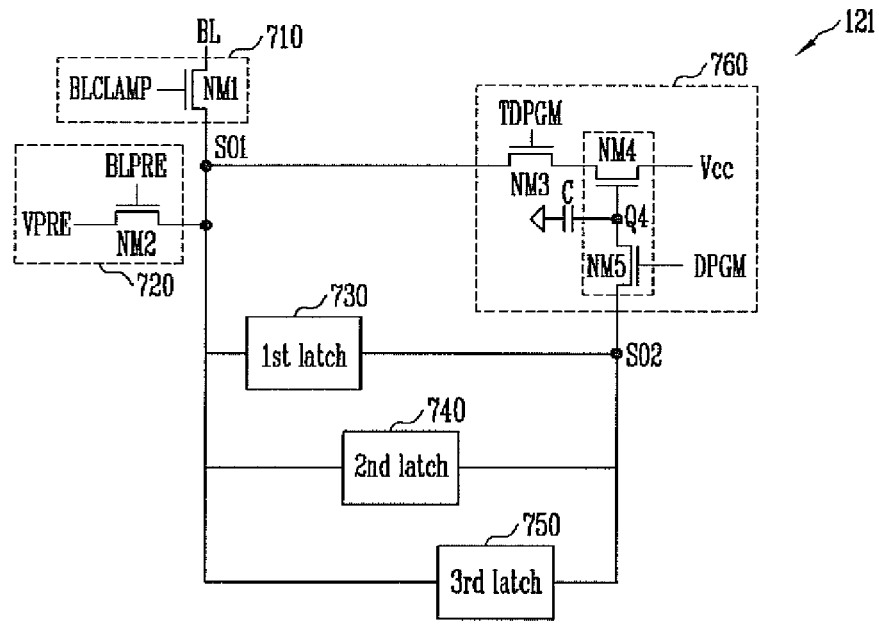
FIGS. 7A through 7D illustrate page buffers according to a second embodiment of the present invention.

The entire configuration of the page buffer is briefly shown in FIG. 7A. Latch circuits of the page buffer of FIG. 7A are detailed in FIGS. 7B to 7D, respectively. FIGS. 7A to 7D depict the parts of the semiconductor memory device modified for the second embodiment, to where other parts of which may be same as those of the first embodiment.

Referring to FIG. 7A, a page buffer 121 including a dynamic latch is comprised of a bit-line connection circuit 710, a precharging circuit 720, and first to fourth latch circuits 730, 740, 750 and 760.

The bit-line connection circuit 710 is provided to electrically connect a bit line BL with a first sensing node S01. The bit-line connection circuit 710 may include a first transistor NM1. The first transistor NM1 is coupled between the bit line BL and the first sensing node S01 To the gate of the first transistor NM1 is applied a bit-line connection signal BLCLAMP.

The precharging circuit 720 functions to precharge the first sensing node S01. A second transistor NM2 of the precharging circuit 720 is coupled between an input terminal of a precharging voltage VPRE and the first sensing node S01. To the gate of the second transistor NM2 is applied a precharging signal BLPRE.

The first to fourth latch circuit 730~760 are coupled between the first and second sensing nodes S01 and S02 in parallel. The first to third latch circuits 730~750 are described in conjunction with FIGS. 7B through 7C.

The fourth latch circuit 760 is formed of a dynamic latch, including third to fifth transistors NM3~NM5 and a capacitor C.

The third and fourth transistors NM3 and NM4 are serially coupled between the first sensing node S01 and an input terminal of the power voltage Vcc. To the gate of the third transistor NM3 is to applied a fourth transmission signal TDPGM. The gate of the fourth transistor NM4 is coupled to a node Q4.

The fifth transistor NM5 is coupled between the node Q4 and the second sensing node S02. To the gate of the fifth transistor NM5 is applied a double program control signal TDPGM.

The capacitor C is coupled between a ground node and the node Q4. Data stored in the fourth latch circuit 160 is dependent upon a voltage charged at the capacitor C. As the capacitor C is discharged over time, the fourth latch circuit 760 must be refreshed periodically. For refreshing data, it may add an additional latch circuit or utilize one of the first to third latch circuits 730~750.

The first to third latch circuits 730~750 are same each other in circuit organization.

Figure 7B:
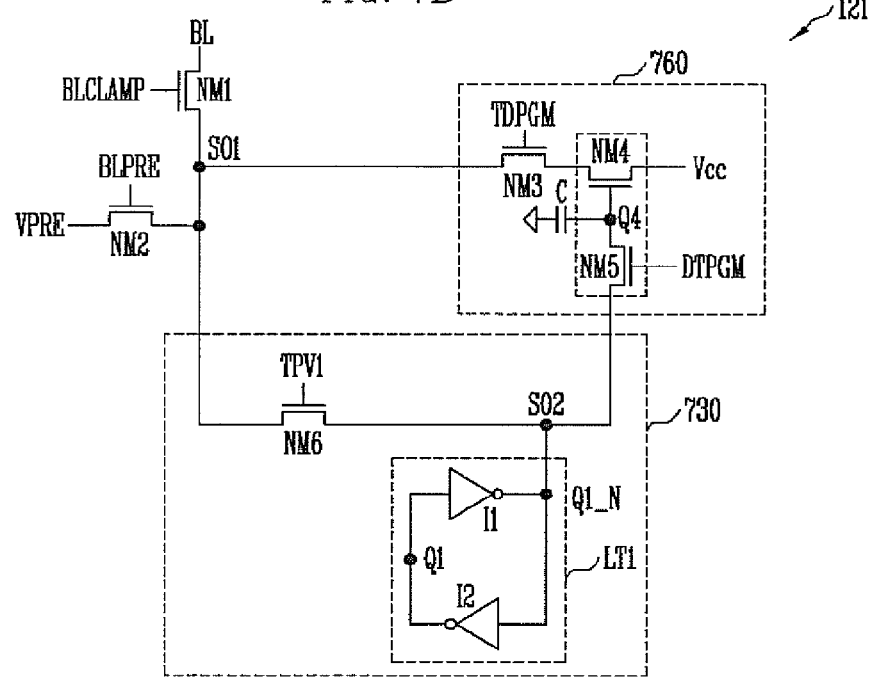
Figure 7C:
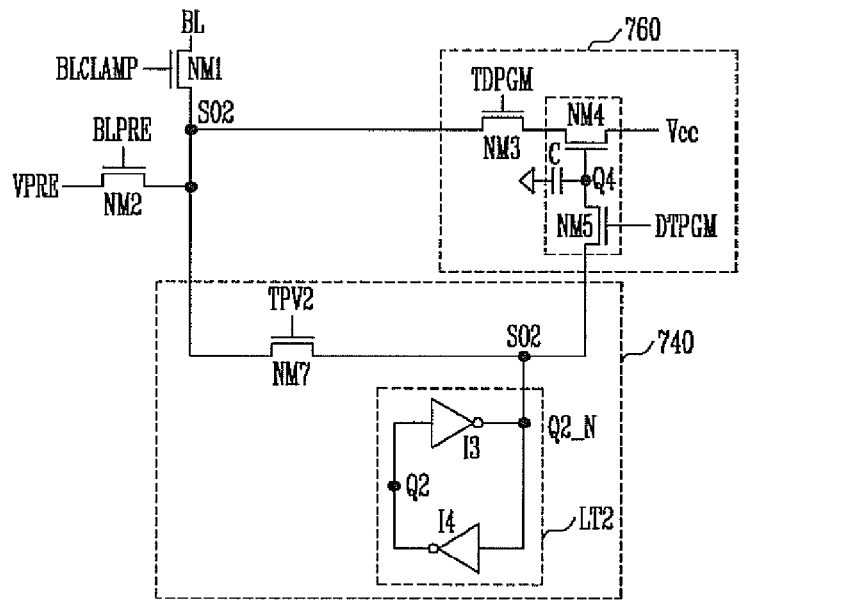
Figure 7D:
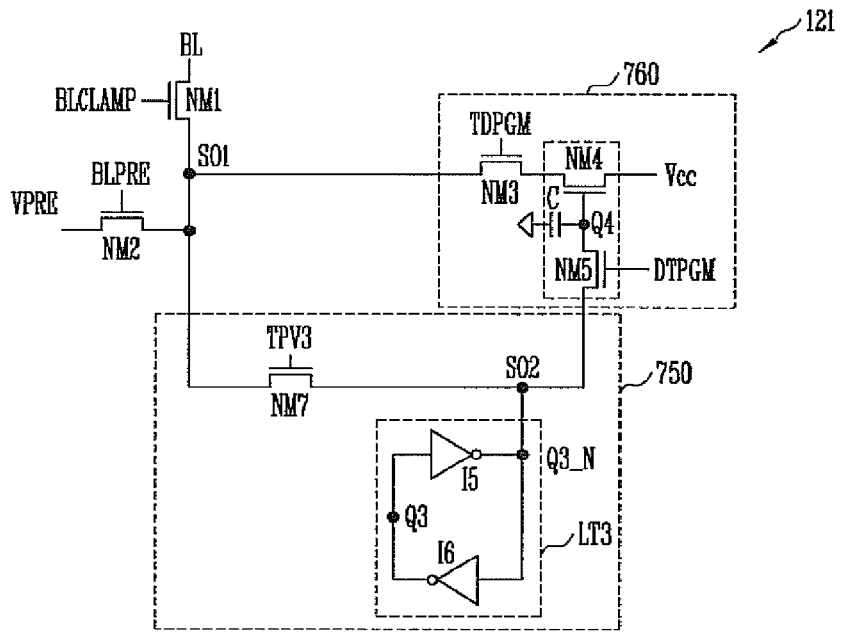

Referring to FIGS. 7B to 7D, the first latch circuit 730 includes a sixth NMOS transistor NM6 and a first latch LT1.

The sixth transistor NM6 is coupled between the first and second sensing nodes S01 and S02. To the gate of the sixth transistor NM6 is applied a first transmission signal TPV1. The first latch LT1 includes first and second inverters I1 and I2. A node Q1_N of the first latch LT1 is coupled to the second sensing node S02.

Referring to FIG. 7C, the second latch circuit 740 includes a seventh transistor NM7 and a second latch LT2.

The seventh transistor NM7 is coupled between the first and second sensing nodes S01 and S02. To the gate of the seventh to transistor NM7 is applied a second transmission signal TPV2. The second latch LT2 includes third and fourth inverters I3 and I4. A node Q2_N of the second latch LT2 is coupled to the second sensing node S02.

Referring to FIG. 7D, the third latch circuit 750 includes an eighth transistor NM8 and a third latch LT3.

The eighth transistor NM8 is coupled between the first and second sensing nodes S01 and S02. To the gate of the eighth transistor NM8 is applied a third transmission signal TPV3. The third latch LT3 includes fifth and sixth inverters I5 and I6. A node Q3_N of the third latch LT3 is coupled to the second sensing node S02.

The first to eighth transistors NM1~NM8 may include N-type metal-oxide-semiconductor (NMOS) transistors.

A programming according to the second embodiment is described by means of the page buffer 121 shown in FIGS. 7B to 7C.

FIG. 8 shows waveforms of voltages applied to a selected word line in a programming operation according to the second embodiment.

Referring to FIG. 8, the second embodiment is practiced by applying program voltages respectively for programming the first to third memory cell groups.

Beginning a programming operation, a program start voltage Vst1 is applied to program the first memory cell group, a program start voltage Vst2 is applied to program the second memory cell to group, and a program start voltage Vst3 is applied to program the third memory cell group, in this order.

And, each program voltage increases in the unit of step voltage Vsp, from each program start voltage, every a pulse of the program voltage.

To program the first to third memory cell groups, the first to fourth latch circuits 730~760 of the page buffer 121 need to be set with their initial data.

TABLE 2

|   | Q4 | Q1_N | Q2_N | Q3_N | Vst1 | Vst2 | Vst3 |
|---|----|------|------|------|------|------|------|
| A | 1  | 1    | 1    | 1    | Inhibit | Inhibit | Inhibit |
| B | 0  | 0    | 1    | 1    | DPGM | Inhibit | Inhibit |
| C | 0  | 1    | 0    | 1    | Inhibit | DPGM | Inhibit |
| D | 1  | 1    | 1    | 0    | Inhibit | Inhibit | Program |

In Table 2, initial set data of the first to fourth latch circuits 730~760 of the page buffers 121 coupled to memory cells corresponding to the erased memory cell group A, and the first to third memory cell groups B, C and D are shown.

In Table 2, 'DPGM' denotes a programming with double verifying. The first and second memory cell groups are double verified.

To independently program the first to third memory cell groups, the second and third memory cell groups should be program-inhibited while programming the first memory cell group. The first and third memory cell groups should be program-inhibited while to programming the second memory cell group. And, the first and second memory cell groups must be program-inhibited while programming the third memory cell group.

For these independently cooperative program inhibitions and programming operations, it is desirable for the semiconductor memory device to set bit line voltages before programming.

Figure 9C:
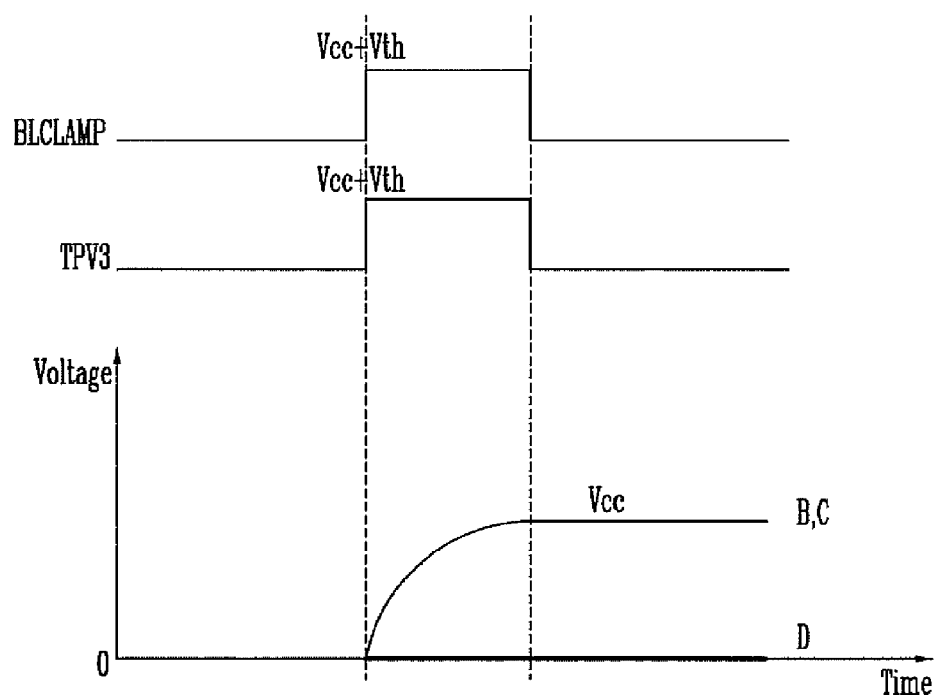

FIGS. 9A to 9C are timing diagrams illustrating a bit-line voltage setting process for the programming operation according to the second embodiment, which is described with reference to FIGS. 7A to 8.

FIG. 9A shows sequential waveforms of control signals for setting bit line voltages before programming, and a variation of the bit line voltages per one time.

Referring to FIG. 9, first, all of the bit lines are precharged to the level of the power voltage Vcc (not shown).

Then, the bit-line connection signal BLCLAMP is applied in a level Vcc+Vth. The fourth transmission signal TDPGM is applied in a level aV+Vth. Accordingly, a bit line coupled to a page buffer 121 where a node Q4 is conditioned in '0' is charged to aV. Another bit line coupled to another page buffer 121 where a node Q4 is conditioned in '1' is retained on the level of the power voltage Vcc.

After turning the fourth transmission signal TDPGM to 0V, the first transmission signal TPV1 is applied in Vcc+Vth.

If the first transmission TPV1 is leveled on Vcc+Vth, a bit line coupled to a page buffer 121 where a node Q1_N is conditioned in '0' is changed to 0V and another bit line coupled to a page buffer 121 where a node Q1_N is conditioned in '1' is charged up to the level of the power voltage Vcc.

For instance, it is assumed that there are disposed a first memory cell Cb belonging to the first memory cell group and a second memory cell Cc belonging to the second memory cell group.

Here, referring to Table 2, in a page buffer 121 coupled to the first memory cell Cb, nodes Q4 and Q1_N are conditioned in '0'. In another page buffer 121 coupled to the second memory cell Cc, a node Q4 is conditioned in '0' while a node Q1_N is conditioned in '1'.

Under the condition that all of the bit lines have been precharged to the level of the power voltage Vcc, the bit-line connection signal BLCLAMP is applied in the level Vcc+Vth. If the fourth transmission signal TDPGM is applied in the level aV+Vth, the bit lines coupled to the first and second memory cells Cb and Cc are charged to aV.

If the first transmission signal TPV1 is applied in the level Vcc+Vth, the bit line coupled to the first memory cell Cb goes to '0' and the bit line coupled to the second memory cell Cc goes to the level of the power voltage Vcc. Then, if the program voltage Vst1 is applied, the first memory cell Cb is programmed but the second memory cell Cc is program-inhibited.

Before applying the program voltage Vst2 for the second memory cell group, the bit lines are set in voltage so as to inhibit the first and third memory cell groups from being programmed.

Referring to FIG. 9B, a bit line setting for programming the second memory cell group begins with precharging all of the bit lines up to the level of the power voltage Vcc (not shown).

Then, the bit-line connection signal BLCLAMP is applied in the level Vcc+Vth. The fourth transmission signal TDPGM is applied in the level aV+Vth. Accordingly, a bit line coupled to a page buffer 121 where a node Q4 is conditioned in '0' is charged to aV.

If the second transmission TPV2 is leveled on Vcc+Vth, a bit line coupled to a page buffer 121 where a node Q1_N is conditioned in '0' is changed to 0V and another bit line coupled to a page buffer 121 where a node Q1_N is conditioned in '1' is charged up to the level of the power voltage Vcc.

After the bit line setting stated above, bit lines coupled to the second memory cell group that has not been yet completely programmed are set on aV or the level of the power voltage Vcc, while bit lines coupled to the rest memory cell groups are charged to the level of the power voltage Vcc.

Therefore, the rest memory cell groups, but the second memory cell group that has not been completed in programming, are program-inhibited.

Before applying the program voltage Vst3 for the third memory cell group, setting voltages the bit lines is conducted as shown in FIG. 9C.

Referring to FIG. 9C, after precharging all of the bit lines to the level of the power voltage Vcc, the bit-line connection signal BLCLAMP and the third transmission signal TPV3 are applied in a level Vcc+Vth. According to this, a bit line coupled to a page buffer 121 where a node Q3_N is conditioned in '0' is changed to 0V. The other bit lines are charged up to the level of the power voltage Vcc. Thus, the third memory cell group is exclusively programmed.

After applying the program voltages to the first to third memory cell groups, the program-verification operations are sequentially conducted with the first and second double verifying voltages PV0 and PV2-1 and the first to third verifying voltages PV1~PV3.

From the program-verification operations, results by the first and second double verifying voltages PV0 and PV2-1 are stored in the fourth latch circuits 760 of the page buffers 121. A result by the first verifying voltage PV1 is stored in the first latch circuits 730 of the page buffers 121. A result by the second verifying voltages PV2 is stored in the second latch circuits 740 of the page buffers 121. A result by the third verifying voltages PV3 is stored in the third latch circuits 750 of the page buffers 121.

In program-verification with the first and second double verifying voltages PVC) and PV2-1, it is desirable to differentiate the first and second memory cell groups by means of data states of the second latch circuits 740, as stated above in conjunction with FIGS. 7A to 7D.

According to the exemplary embodiment stated above, programming times between memory cells to be programmed to have relatively high threshold voltages and memory cells to be programmed to have relatively low threshold voltages are controlled by conducting verification operations after sequentially applying program voltages in accordance with threshold voltage distributions. Thus, the memory cells to be programmed to have relatively low threshold voltages are less affected from the memory cells that are to be programmed to have relatively high threshold voltages.

The foregoing is illustrative of exemplary embodiments and is not to be construed as limiting thereof. Although a few exemplary embodiments have been described, those skilled in the art will readily appreciate that many modifications are possible in exemplary embodiments without materially departing from the novel teachings and advantages. Accordingly, all such modifications are intended to be included within the scope of this invention as defined in the claims.

What is claimed is:

1. A method of programming a semiconductor memory device, the method comprising:
    grouping memory cells into memory cell groups in accordance with target program voltage levels;
    performing program operations on the memory cell groups by sequentially applying program voltages corresponding to the target program voltage levels to the memory cell groups; and
    program-verifying the memory cell groups in sequence after the program operations on all of the memory cell groups are performed.

2. The method of claim 1, wherein the program operations start with a program voltage corresponding to the lowest threshold voltage and ends with a program voltage corresponding to the highest threshold voltage.

3. The method of claim 1, wherein, while applying the program voltage to one of the memory cell groups, the others of the memory cell groups are inhibited from being programmed.

4. A method of programming a semiconductor memory device, memory cells of which are programmed to have one of first to third threshold voltage distributions, the method comprising:
    applying a first program voltage to program a first memory cell group whose threshold voltages are to be shifted into the first threshold voltage distribution;
    applying a second program voltage to program a second memory cell group whose threshold voltages are to be shifted into the third threshold voltage distribution; and
    program-verifying the first and second memory cell groups in sequence after the first program voltage is applied to the first memory cell group and the second program voltage is applied to the second memory cell group.

5. The method of claim 4, further comprising, before the application of the first program voltage, setting a bit line voltage to inhibit the second memory cell group from being programmed.

6. The method of claim 4, further comprising, before the application of the second program voltage, setting a bit line voltage to inhibit the first memory cell group from being programmed.

7. The method of claim 4, wherein the first memory cell group includes memory cells whose threshold voltages are to be shifted into the second threshold voltage distribution.

8. The method of claim 4, wherein the second memory cell group includes memory cells whose threshold voltages are to be shifted into the second threshold voltage distribution.

9. A method of programming a semiconductor memory device, memory cells of which are programmed to have one of first to third threshold voltage distributions, the method comprising:
    applying a first program voltage to program a first memory cell group whose threshold voltages are to be shifted into the first threshold voltage distribution;
    applying a second program voltage to program a second memory cell group whose threshold voltages are to be shifted into the second third threshold voltage distribution;
    applying a third program voltage to program a third memory cell group whose threshold voltages are to be shifted into the third threshold voltage distribution; and
    program-verifying the first through third memory cell groups in sequence after the first program voltage is applied to the first memory cell group, the second program voltage is applied to the second memory cell group, and the third program voltage is applied to the third memory cell group.

10. The method of claim 9, further comprising, before the application of the first program voltage, setting a bit line voltage to inhibit the second and third memory cell groups from being programmed.

11. The method of claim 9, further comprising, before the application of the second program voltage, setting a bit line voltage to inhibit the first and third memory cell groups from being programmed.

12. The method of claim 9, further comprising, before the application of the third program voltage, setting a bit line voltage to inhibit the first and second memory cell groups from being programmed.

* * * * *